US012391569B2

(12) United States Patent
Kageyama et al.

(10) Patent No.: US 12,391,569 B2
(45) Date of Patent: Aug. 19, 2025

(54) BLACK MATERIAL AND METHOD FOR PRODUCING SAME, BLACK PHOTOSENSITIVE COMPOSITION AND METHOD FOR PRODUCING SAME, AND BLACK PATTERNING FILM AND METHOD FOR FORMING SAME

(71) Applicants: Mitsubishi Materials Electronic Chemicals Co., Ltd., Akita (JP); MITSUBISHI MATERIALS CORPORATION, Tokyo (JP)

(72) Inventors: Kensuke Kageyama, Akita (JP); Takashi Konishi, Akita (JP); Tasuku Sugiura, Naka (JP); Masaya Karube, Naka (JP)

(73) Assignees: Mitsubishi Materials Electronic Chemicals Co., Ltd., Akita (JP); MITSUBISHI MATERIALS CORPORATION, Tokyo (JP)

( * ) Notice: Subject to any disclaimer, the term of this patent is extended or adjusted under 35 U.S.C. 154(b) by 548 days.

(21) Appl. No.: 17/801,627

(22) PCT Filed: Oct. 30, 2020

(86) PCT No.: PCT/JP2020/040745
§ 371 (c)(1),
(2) Date: Aug. 23, 2022

(87) PCT Pub. No.: WO2021/171703
PCT Pub. Date: Sep. 2, 2021

(65) Prior Publication Data
US 2023/0108923 A1 Apr. 6, 2023

(30) Foreign Application Priority Data
Feb. 25, 2020 (JP) ................. 2020-028991

(51) Int. Cl.
*C01G 25/00* (2006.01)
*G03F 7/004* (2006.01)
(52) U.S. Cl.
CPC .......... *C01G 25/00* (2013.01); *G03F 7/0042* (2013.01); *C01P 2006/60* (2013.01)
(58) Field of Classification Search
CPC ..................................... C01G 25/00
See application file for complete search history.

(56) References Cited

U.S. PATENT DOCUMENTS

2019/0367364 A1  12/2019  Kageyama et al.
2020/0156943 A1  5/2020  Kageyama et al.

FOREIGN PATENT DOCUMENTS

CN  105932242 A  *  9/2016  .......... H01M 10/052
CN  107586472 A  *  1/2018
(Continued)

OTHER PUBLICATIONS

Ekaterina Malikova et al., "On the mechanism of zirconium nitride formation by zirconium, zirconia and yttria burning in air", Journal of Solid State Chemistry, vol. 230, Oct. 1, 2015, pp. 199-208. (cited in the Feb. 8, 2024 Search Report issued for EP20921996.3).

(Continued)

*Primary Examiner* — Amanda C. Walke
(74) *Attorney, Agent, or Firm* — Troutman Pepper Locke LLP

(57) ABSTRACT

A black material of the present invention consists of a zirconium nitride powder containing yttrium. The amount of the yttrium is 1.0% by mass to 12.0% by mass with respect to a total 100% by mass of the zirconium nitride powder and the yttrium. In a transmission spectrum obtained from a dispersion in which the concentration of the zirconium nitride powder containing yttrium is 50 ppm, assuming that the light transmittance at a wavelength of 550 nm is denoted (Continued)

by $X_1$, and the light transmittance at a wavelength of 365 nm is denoted by $X_2$, $X_1$ is 7.5% or less, $X_2$ is 25% or more, and $X_2/X_1$ is 3.5 or more.

9 Claims, 1 Drawing Sheet

(56) References Cited

FOREIGN PATENT DOCUMENTS

| EP | 3521242 A1 | 8/2019 |
|---|---|---|
| EP | 3636591 A1 | 4/2020 |
| JP | 2017-222559 A | 12/2017 |
| JP | 2018-083730 A | 5/2018 |
| JP | 2018-203599 A | 12/2018 |
| JP | 2020-019691 A | 2/2020 |
| JP | 2020-019692 A | 2/2020 |
| KR | 20200029832 A * | 3/2020 |
| TW | 202007719 A | 2/2020 |
| WO | 2018/061666 A1 | 4/2018 |
| WO | 2018/225318 A1 | 12/2018 |
| WO | 2019/124100 A1 | 6/2019 |

OTHER PUBLICATIONS

Y.P. Kathuria et al., "Physical aspects of laser nitriding of yttria stabilized t-zirconia", Applied Surface Science, vol. 254, No. 4, Nov. 23, 2007, pp. 937-941. (cited in the Feb. 8, 2024 Search Report issued for EP20921996.3).

Supplementary European Search Report dated Feb. 8, 2024 issued for EP20921996.3.

International Search Report mailed Dec. 22, 2020, issued for PCT/JP2020/040745 and English translation thereof.

Office Action mailed Apr. 19, 2024, issued for TW109138179 and English translation of the Search Report.

* cited by examiner

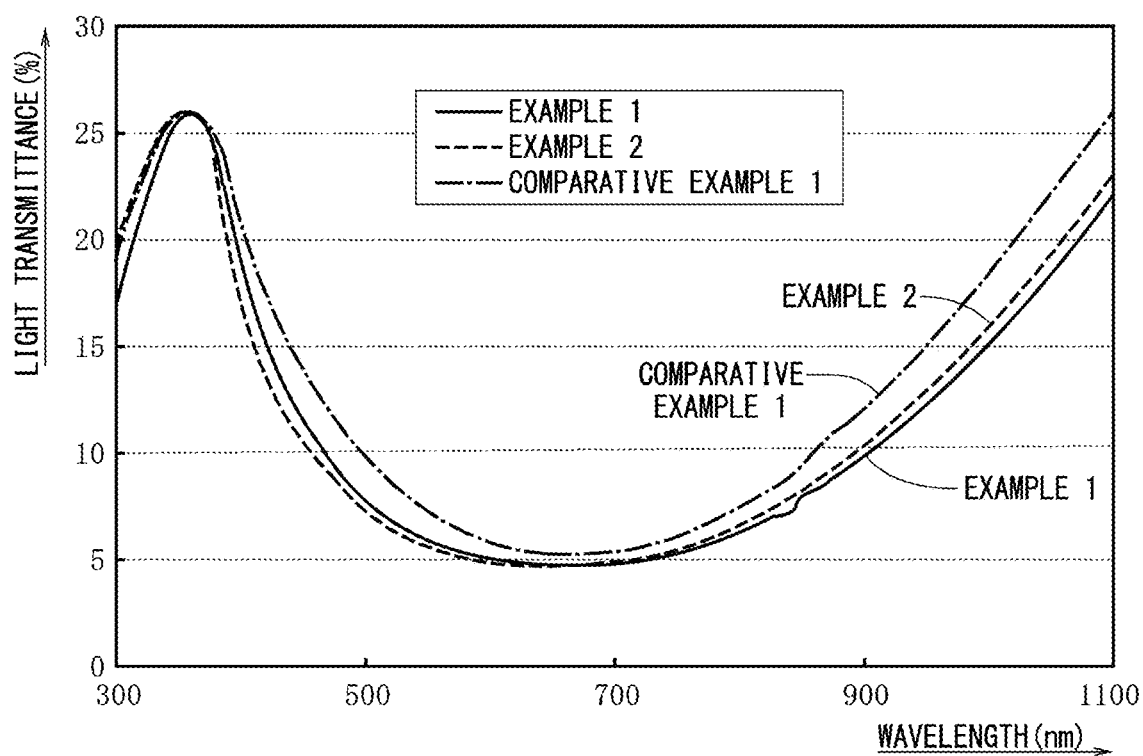

BLACK MATERIAL AND METHOD FOR PRODUCING SAME, BLACK PHOTOSENSITIVE COMPOSITION AND METHOD FOR PRODUCING SAME, AND BLACK PATTERNING FILM AND METHOD FOR FORMING SAME

TECHNICAL FIELD

The present invention relates to a black material capable of improving a light-shielding property while maintaining the ultraviolet ray transmittance and a method for producing the black material, a black photosensitive composition containing the black material and a method for producing this composition, and a black patterning film having high resolution and high light-shielding performance and a method for forming this film.

BACKGROUND ART

In the related art, it is disclosed that zirconium nitride powder has a specific surface area of 20 to 90 m$^2$/g, which is measured by the BET method, and has a zirconium nitride peak in the X-ray diffraction profile, while having no zirconium dioxide peak, no low-order zirconium oxide peak, and no low-order zirconium oxynitride peak (see, for example, Patent Document 1 (claims 1, 6, and 7, paragraphs [0016], [0022], [0023], and FIGS. 1 and 2)). Regarding this zirconium nitride powder, a light transmittance X at a wavelength of 370 nm is at least 18%, a light transmittance Y at a wavelength of 550 nm is 12% or less in a dispersion transmission spectrum having a powder concentration of 50 ppm, and (X/Y) of the light transmittance Y at a wavelength of 550 nm to the light transmittance X at a wavelength of 370 nm is 2.5 or more.

Precipitation can be suppressed in a case where the zirconium nitride powder is used as a resist since the zirconium nitride powder thus configured has a specific surface area of 20 m$^2$/g or more, and the zirconium nitride powder has a sufficient light-shielding property since the specific surface area thereof is 90 m$^2$/g or less. In addition, in the X-ray diffraction profile, since the zirconium nitride powder has a zirconium nitride peak, while having no zirconium dioxide peak, no low-order zirconium oxide peak, and no low-order zirconium oxynitride peak, a light transmittance X at a wavelength of 370 nm is at least 18%, a light transmittance Y at a wavelength of 550 nm is 12% or less in a dispersion transmission spectrum having a powder concentration of 50 ppm, and X/Y is 2.5 or more. Since X/Y is 2.5 or more, ultraviolet rays can be further transmitted. As a result, in a case where a black photosensitive composition is prepared by using the zirconium nitride powder, and a black patterning film is formed by using this black photosensitive composition, a patterning film having high resolution can be formed, and the patterning film thus formed also has light-shielding performance.

CITATION LIST

Patent Document

[Patent Document 1]
Japanese Unexamined Patent Application, First Publication No. 2017-222559

SUMMARY OF INVENTION

Technical Problem

However, the black patterning film made of the black photosensitive composition containing the zirconium nitride powder disclosed in the above-described Patent Document 1 of the related art has the sufficient ultraviolet ray transmittance, but not sufficient light-shielding property. Therefore, in a case where the black patterning film is used as a light-shielding material for camera modules, and the like, the ultraviolet ray transmittance is reduced in a case where the target light-shielding property is achieved, and a resin in the black patterning film is not sufficiently cured, resulting in causing the problem in which lithography characteristics deteriorates.

A first object of the present invention is to provide a black material and a method for producing the same, and a black photosensitive composition and a method for producing the same, which can improve a light-shielding property while maintaining the ultraviolet ray transmittance. A second object of the present invention is to provide a black patterning film having high resolution and high light-shielding performance and a method for forming the same.

Solution to Problem

A first aspect of the present invention is a black material consisting of a zirconium nitride powder containing yttrium, in which the amount of the yttrium is 1.0% by mass to 12.0% by mass with respect to a total 100% by mass of the zirconium nitride powder and the yttrium, and in a transmission spectrum obtained from a dispersion in which a concentration of the zirconium nitride powder containing yttrium is 50 ppm, assuming that the light transmittance at a wavelength of 550 nm is denoted by $X_1$, and the light transmittance at a wavelength of 365 nm is denoted by $X_2$, $X_1$ is 7.5% or less, $X_2$ is 25% or more, and $X_2/X_1$ is 3.5 or more. In the present specification, the "light transmittance $X_1$ at a wavelength of 550 nm" means a transmittance $X_1$ of visible light having a wavelength of 550 nm, and the "light transmittance $X_2$ at a wavelength of 365 nm" means a transmittance $X_2$ of ultraviolet rays having a wavelength of 365 nm.

A second aspect of the present invention is a method for producing the black material according to the first aspect including a step of preparing a mixed powder by mixing a zirconium dioxide powder containing an yttrium oxide powder with either a magnesium oxide powder or a magnesium nitride powder or both of a magnesium oxide powder and a magnesium nitride powder, and a metallic magnesium powder in a N$_2$ gas atmosphere, N$_2$ and H$_2$ mixed gas atmosphere, N$_2$ and Ar mixed gas atmosphere, or N$_2$ and NH$_3$ mixed gas atmosphere; a step of preparing a zirconium nitride powder containing yttrium by bringing the mixed powder into a nitride reaction in the N$_2$ gas atmosphere, N$_2$ and H$_2$ mixed gas atmosphere, N$_2$ and Ar mixed gas atmosphere, or N$_2$ and NH$_3$ mixed gas atmosphere; a step of washing and neutralizing the zirconium nitride powder containing yttrium to prepare a black slurry; and a step of separating a solid content from the black slurry and drying the separated solid content.

A third aspect of the present invention is a method for producing a black material including a step of obtaining the black material according to the first aspect by bringing a metallic zirconium powder and a metallic yttrium powder into a synthesis nitride reaction in a N$_2$ gas atmosphere, N$_2$ and $H_2$ mixed gas atmosphere, $N_2$ and Ar mixed gas atmosphere, or $N_2$ and $NH_3$ mixed gas atmosphere, by a thermal plasma method, to prepare the zirconium nitride powder containing yttrium.

A fourth aspect of the present invention is a black photosensitive composition including the black material according to the first aspect.

A fifth aspect of the present invention is a method for producing a black photosensitive composition containing the black material produced by the method according to the second or third aspect.

A sixth aspect of the present invention is a black patterning film formed by the black photosensitive composition according to the fourth aspect.

A seventh aspect of the present invention is a method for forming a black patterning film including a step of forming the black patterning film by using the black photosensitive composition produced by the method according to the fifth aspect.

Advantageous Effects of Invention

The black material according to the first aspect of the present invention contains the yttrium in an amount of 1.0% by mass to 12.0% by mass with respect to a total 100% by mass of the zirconium nitride powder and the yttrium. Therefore, in a transmission spectrum obtained from a dispersion in which a concentration of the zirconium nitride powder containing yttrium is 50 ppm, assuming that light transmittance at a wavelength of 550 nm is denoted by $X_1$, and a light transmittance at a wavelength of 365 nm is denoted by $X_2$, $X_1$ is 7.5% or less, $X_2$ is 25% or more, and $X_2/X_1$ is 3.5 or more, thereby capable of improving a light-shielding property. That is, it is possible to improve the light-shielding property at a wavelength of 550 nm while maintaining the ultraviolet ray transmittance having a wavelength of 365 nm as compared with a black material in the related art. As a result, in a case where the black patterning film is formed by a black photosensitive composition using the black material, a high-resolution black patterning film having higher light-shielding performance can be formed. It is presumed that the reason why the light-shielding property at a wavelength of 550 nm and the ultraviolet ray transmittance having a wavelength of 365 nm are improved by the zirconium nitride powder including yttrium is because the yttrium has been incorporated into a crystal lattice of zirconium nitride as yttrium nitride.

In the method for producing a black material according to the second aspect of the present invention, the zirconium dioxide powder containing the yttrium oxide powder is brought into a nitride reaction by using either the magnesium oxide powder or the magnesium nitride powder or both of the magnesium oxide powder and the magnesium nitride powder, and the metallic magnesium powder in the $N_2$ gas atmosphere or the like. Therefore, the black material capable of improving the ultraviolet ray transmittance can be produced. As a result, in a case where the black patterning film is formed by the black photosensitive composition using the black material, as described above, a high-resolution black patterning film can be formed, and the formed black patterning film also has high light-shielding performance. It is presumed that the reason why the light-shielding property can be improved in a case where zirconium dioxide containing yttrium oxide is brought into the nitride reaction using magnesium oxide and a magnesium metal in the $N_2$ gas atmosphere or the like is based on the fact that zirconium nitride containing yttrium is generated due to the nitride reaction of zirconium dioxide and yttrium oxide.

In the method for producing a black material according to the third aspect of the present invention, the metallic zirconium powder and the metallic yttrium powder are brought into the synthesis nitride reaction by a thermal plasma method in the $N_2$ gas atmosphere or the like. As a result, a nano-sized black material capable of improving the ultraviolet ray transmittance can be produced. As a result, in a case where the black patterning film is formed by the black photosensitive composition using the black material, as described above, a high-resolution black patterning film can be formed, and the formed black patterning film also has high light-shielding performance. It is presumed that the reason why the light-shielding property can be improved in a case where the metallic zirconium powder and the metallic yttrium powder are brought into the synthesis nitride reaction by a thermal plasma method in the $N_2$ gas atmosphere or the like is based on the fact that zirconium nitride containing yttrium is generated due to the nitride reaction of metallic zirconium and metallic yttrium.

The black photosensitive composition according to the fourth aspect of the present invention contains the above-described black material. Therefore, in a case where the black patterning film is formed by using this composition, as described above, a high-resolution black patterning film having higher light-shielding performance can be formed.

In the method for producing a black photosensitive composition according to the fifth aspect of the present invention, the black photosensitive composition is produced using the black material produced by the above-described method. Therefore, in a case where the black patterning film is formed by using this composition, as described above, a high-resolution black patterning film having higher light-shielding performance can be formed.

The black patterning film according to the sixth aspect of the present invention is the black patterning film formed by the black photosensitive composition. Therefore, as described above, a high-resolution black patterning film having higher light-shielding performance can be formed.

In the method for forming a black patterning film according to the seventh aspect of the present invention, the black patterning film is formed using the black photosensitive composition produced by the above-described method. Therefore, as described above, a high-resolution black patterning film having higher light-shielding performance can be formed.

BRIEF DESCRIPTION OF DRAWING

FIG. 1 is a spectroscopic curve showing light transmittance obtained from a dispersion obtained by diluting, at a powder concentration, a black material obtained in Example 1, Example 2, and Comparative Example 1 of the present invention to 50 ppm.

DESCRIPTION OF EMBODIMENTS

Subsequently, an embodiment of the present invention will be described with reference to the FIGURES. A black material consists of a zirconium nitride powder containing yttrium. In addition, the amount of the yttrium is 1.0% by mass to 12.0% by mass and preferably 2.0% by mass to 11.0% by mass, with respect to a total 100% by mass of the zirconium nitride powder and the yttrium. Furthermore, an average primary particle size of the zirconium nitride powder containing yttrium is preferably 10 nm to 100 nm. Here, the reason why the amount of the yttrium with respect to the total 100% by mass of the zirconium nitride powder and the yttrium is limited to the range of 1.0% by mass to 12.0% by mass is because a light-shielding property at a wavelength of 550 nm (visible light) is lowered in a case where the content ratio is less than 1.0% by mass or more than 12.0% by mass. Furthermore, the reason why the preferable average primary particle size of the zirconium nitride powder containing yttrium is limited to the range of 10 nm to 100 nm is because the light-shielding property at a wavelength of 550 nm (visible light) is lowered in a case where the preferable average primary particle size is less than 10 nm or more than 100 nm. The yttrium is contained in a solid solution state with the zirconium nitride powder. An yttrium content in the zirconium nitride powder containing yttrium is a value measured by ICP emission spectroscopic analysis. Furthermore, the average primary particle size of the zirconium nitride powder containing yttrium is a value measured in terms of a sphere from a measured value of a specific surface area.

In a transmission spectrum obtained from a dispersion in which a concentration of the zirconium nitride powder containing yttrium is 50 ppm, assuming that a light transmittance at a wavelength of 550 nm is denoted by $X_1$, and a light transmittance at a wavelength of 365 nm is denoted by $X_2$, $X_1$ is 7.5% or less and preferably 6.5% or less, $X_2$ is 25% or more and preferably 26% or more, and $X_2/X_1$ is 3.5 or more and preferably 4.0 or more. Here, the reason why the light transmittance $X_1$ is limited to 7.5% or less is because the light-shielding property of the formed patterning film is insufficient and a high OD value cannot be obtained in a case where the light transmittance $X_1$ is more than 7.5%. In addition, the reason why the light transmittance $X_2$ is limited to 25% or more is because in a case where the light transmittance $X_2$ is less than 25%, the bottom portion of a photoresist film is not exposed in a case where the black patterning film is formed by the black photosensitive composition using the black material, and an undercut occurs in the patterning film. Furthermore, the reason why $X_2/X_1$ is limited to 3.5 or more is because in consideration of contradictory characteristics of the light transmittance $X_1$ and the light transmittance $X_2$, ultraviolet rays are effectively transmitted, and priority is given to not causing an undercut in the patterning film, by setting $X_2/X_1$ to 3.5 or more.

A method for producing the black material configured as described above will be described.

<First Production Method>

First, a mixed powder is prepared by mixing a zirconium dioxide ($ZrO_2$) powder containing an yttrium oxide ($Y_2O_3$) powder with either a magnesium oxide powder or a magnesium nitride powder or both of a magnesium oxide powder and a magnesium nitride powder, and a metallic magnesium powder in a $N_2$ gas atmosphere, $N_2$ and $H_2$ mixed gas atmosphere, $N_2$ and Ar mixed gas atmosphere, or $N_2$ and $NH_3$ mixed gas atmosphere. Examples of the yttrium oxide powder include yttrium oxide powder such as the cubic structure of yttrium oxide and amorphous yttrium oxide. As the zirconium dioxide powder, for example, any powder consisting of zirconium dioxide such as monoclinic zirconium dioxide, cubic zirconium dioxide, and yttrium-stabilized zirconium dioxide can be used, but monoclinic zirconium dioxide powder is preferable from the viewpoint that the production rate of the zirconium nitride powder increases. The zirconium dioxide ($ZrO_2$) powder containing the yttrium oxide ($Y_2O_3$) powder can also be obtained such that an aqueous solution of an inorganic or organic salt of zirconium and an inorganic or organic salt of yttrium is made alkaline, and yttrium hydroxide and zirconium hydroxide are coprecipitated, dried, and calcined.

Furthermore, the yttrium oxide powder preferably has an average primary particle size of 10 nm or more and 500 nm or less, and the zirconium dioxide powder preferably has an average primary particle size of 10 nm or more and 500 nm or less. Here, the reason why the preferable average primary particle size of the yttrium oxide powder is limited to the range of 10 nm or more and 500 nm or less is because the light-shielding property deteriorates due to too small particle size of yttrium nitride obtained by the reaction in a case where the particle size is less than 10 nm, and the light-shielding property deteriorates due to too large particle size of yttrium nitride obtained by the reaction in a case where the particle size is more than 500 nm. In addition, the reason why the preferable average primary particle size of the zirconium dioxide powder is limited to the range of 10 nm or more and 500 nm or less is because the light-shielding property deteriorates due to too small particle size of zirconium nitride obtained by the reaction in a case where the particle size is less than 10 nm, and the light-shielding property deteriorates due to too large particle size of zirconium nitride obtained by the reaction in a case where the particle size is more than 500 nm. Furthermore, the average primary particle size of each of the yttrium oxide powder and the zirconium dioxide powder is a value measured in terms of a sphere from a measured value of a specific surface area.

In a case where the particle size of the metallic magnesium powder is too small, the reaction proceeds rapidly, so that the risk of operation increases. Therefore, the metallic magnesium powder preferably has a particle size of 100 μm to 1000 μm, and in particular, a particle size of 200 μm to 500 μm is preferable in a mesh path of a sieve. However, even in a case where all of particles of the metallic magnesium are not within the above particle size range, 80% by mass or more, particularly 90% by mass or more of the particles of the metallic magnesium may be within the above range. The amount of the metallic magnesium powder added to the zirconium dioxide powder and the amount of $NH_3$ gas, $H_2$ gas, or the like in the atmospheric gas affect the reducing power of the zirconium dioxide. In a case where the amount of metallic magnesium is too small, it is difficult to obtain the desired zirconium nitride powder due to insufficient reduction, and in a case where the amount of metallic magnesium is too large, a reaction temperature sharply increases due to excess metallic magnesium, which may cause grain growth of the powder and becomes uneconomical. It is preferable that depending on the particle size of the metallic magnesium powder, the metallic magnesium powder is added to the zirconium dioxide powder and mix the metallic magnesium powder and the zirconium dioxide powder so that the amount of metallic magnesium is preferably 2.0 times by mol to 6.0 times by mol and still more preferably 3.0 times by mol to 5.0 times by mol relative to zirconium dioxide. Here, the reason why the amount of metallic magnesium is limited to the range of 2.0 times by mol to 6.0 times by mol relative to zirconium dioxide is because the reducing power of zirconium dioxide is insufficient in a case of less than 2.0 times by mol, and a reaction temperature sharply increases due to excess metallic magnesium in a case of more than 6.0 times by mol, which may cause grain growth of the powder and becomes uneconomical.

The magnesium oxide powder or the magnesium nitride powder is added to prevent sintering of zirconium nitride. Depending on the particle size of each of the magnesium oxide powder and the magnesium nitride powder, the magnesium oxide powder or the magnesium nitride powder is added to zirconium dioxide and mixed so that the amount of magnesium oxide or magnesium nitride is preferably 0.3 times by mol to 3.0 times by mol and still more preferably 0.4 times by mol to 2.0 times by mol relative to zirconium dioxide. Here, the reason why the preferable mixing ratio of magnesium oxide or magnesium nitride is limited to the range of 0.3 times by mol to 3.0 times by mol relative to zirconium dioxide is because sintering of the zirconium nitride powder is not prevented in a case of less than 0.3 times by mol, and the amount of an acidic solution required for acid washing after calcination increases in a case of more than 3.0 times by mol. In addition, each of the magnesium oxide powder and the magnesium nitride powder preferably has an average primary particle size of 1000 nm or less in terms of a sphere from the measured value of the specific surface area, and from the viewpoint of easy handling of each powder, the average primary particle size is preferably 500 nm or less to 10 nm or more.

Next, a zirconium nitride powder containing yttrium is prepared by bringing the mixed powder into a nitride reaction in the $N_2$ gas atmosphere, $N_2$ and $H_2$ mixed gas atmosphere, $N_2$ and Ar mixed gas atmosphere, or $N_2$ and $NH_3$ mixed gas atmosphere. A temperature for producing the zirconium nitride powder containing yttrium during a reduction reaction with metallic magnesium is preferably 650° C. to 900° C. and still more preferably 700° C. to 800° C. Here, the reason why the preferable temperature during the reduction reaction is limited to the range of 650° C. to 900° C. is because the temperature of 650° C. is a melting temperature of metallic magnesium, and an insufficient reduction reaction of zirconium dioxide occurs in a case where the temperature is lower than 650° C., and the effect is not enhanced, heat energy is wasted, and particle sintering progresses even in a case where the temperature is higher than 900° C., which is not preferable. The time of the reduction reaction is preferably 30 minutes to 90 minutes, and still more preferably 30 minutes to 60 minutes. In addition, a reaction vessel for carrying out the reduction reaction preferably has a lid so that raw materials or products do not scatter during the reaction. This is because when metallic magnesium is started to melt, the reduction reaction may proceed rapidly, the temperature may increase accordingly, gas inside the vessel may expand, and materials or products inside the vessel may scatter to the outside.

In the atmospheric gases during the reduction reaction, $N_2$ gas has a role of preventing metallic magnesium or reduction products from contacting oxygen, a role of preventing oxidation thereof, and a role of causing nitrogen to react with zirconium to produce zirconium nitride. In addition, $H_2$ gas or $NH_3$ gas has a role of reducing zirconium dioxide, together with metallic magnesium. The $H_2$ gas of 0% by volume to 40% by volume is preferably contained in the atmospheric gas, and 10% by volume to 30% by volume is still more preferably contained therein. The $NH_3$ gas of 0% by volume to 50% by volume is preferably contained in the atmospheric gas, and 0% by volume to 40% by volume is still more preferably contained therein. It is possible to finally produce the zirconium nitride powder that contains no low-order zirconium oxide and no low-order zirconium oxynitride by using these atmospheric gases having the reducing power. On the other hand, in a case where the ratio of $H_2$ gas or the ratio of $NH_3$ gas is higher than this range, the reduction proceeds but the nitrogen source decreases, and as a result, low-order zirconium oxide or low-order zirconium oxynitride is generated, which is not desirable. In addition, it is considered that the reason why the ratio of $NH_3$ gas is higher than the ratio of $H_2$ gas is because $NH_3$ has higher nitriding ability as the gas than that of $H_2$.

Next, the zirconium nitride powder containing yttrium obtained by the above-described nitride reaction is washed and neutralized to prepare a black slurry. Specifically, the zirconium nitride powder containing yttrium obtained by the above-described nitride reaction is taken out from the reaction vessel, finally cooled to room temperature, and washed with an acid solution such as an aqueous hydrochloric acid solution to remove magnesium oxide generated due to the oxidation of metallic magnesium and magnesium oxide or magnesium nitride contained from the beginning of the reaction in order to prevent products from being sintered. The acid washing is preferably performed at a pH of 0.5 or higher, and in particular, at a pH of 1.0 or higher and a temperature of 90° C. or lower. This is because even zirconium may elute in a case where the acidity is too strong or the temperature is too high. After the acid washing, the pH is adjusted to 5 to 6 with aqueous ammonia or the like to obtain a black slurry. Furthermore, a solid content is separated from this black slurry and dried to obtain a black material. Specifically, a black material composed of the zirconium nitride powder containing yttrium having an average primary particle size of 10 nm to 100 nm is obtained by separating the solid content from the black slurry by filtration or centrifugation, drying the solid content, and then pulverizing the solid content.

<Second Production Method>

This production method is a method of producing a zirconium nitride powder containing yttrium to obtain a black material by a thermal plasma method. Although this method has been commonly known as a method for obtaining metal nitride, the method has not been established as a means for obtaining a zirconium nitride powder with high purity. Examples of a device for carrying out the thermal plasma method include a thermal plasma device such as a high frequency induced thermal plasma nanoparticle synthesizer (TP40020NPS manufactured by JEOL Ltd.). This thermal plasma device includes a raw material supply machine that supplies the above described metal powder to a plasma torch, the plasma torch that is connected to the raw material supply machine and that causes the raw material to be brought into a synthesis nitride reaction by the thermal plasma method, an induction coil that is wound around an outer circumference of this plasma torch, a high frequency power supply that is electrically connected to this induction coil and that supplies high frequency power to the induction coil, a chamber through which cooling gas such as $N_2$ gas and Ar gas circulates and which is connected to the plasma torch, and a bag filter that is connected to this chamber and that recovers a zirconium nitride powder containing yttrium.

In order to produce the zirconium nitride powder containing yttrium by using the thermal plasma device, first, the metallic zirconium powder and the metallic yttrium powder as raw materials are supplied to the raw material supply machine. The purity of the metallic zirconium powder is preferably 98% or more, and the average primary particle size is preferably 30 μm or less. The purity of the metallic yttrium powder is preferably 98% or more, and the average primary particle size is preferably 1000 μm or less. Here, the reason why the purity of the metallic zirconium powder is limited to 98% or more is because the purity of the target zirconium nitride containing yttrium is lowered and sufficient characteristics cannot be obtained in a case where the purity is less than 98%. In addition, the reason why the average primary particle size of the metallic zirconium powder is limited to 30 m or less is because a high-purity zirconium nitride powder can be obtained in the case where the average primary particle size is 30 μm or less, whereas dissolution and gasification of the metallic zirconium powder are insufficient in a case where the average primary particle size is more than 30 μm, and as a result, the unnitrided metallic zirconium powder is recovered as it is, and the zirconium nitride powder exhibiting sufficient characteristics cannot be obtained. On the other hand, the reason why the purity of the metallic yttrium powder is limited to 98% or more is because the purity of the target zirconium nitride containing yttrium is lowered and sufficient characteristics cannot be obtained in a case where the purity is less than 98%. In addition, the reason why the average primary particle size of the metallic yttrium powder is limited to 1000 μm or less is because a zirconium nitride powder containing yttrium having a uniform composition cannot be obtained in a case where the average primary particle size is more than 1000 μm. Furthermore, since the metallic yttrium powder that is the raw material of yttrium has a high oxidizing property and is unstable in the air, it is necessary to handle the raw material in an inert atmosphere when supplying the raw material to the raw material supply machine. The average primary particle size of the metallic zirconium powder, the metallic yttrium powder, or the like is a particle size measured by using a particle size distribution measuring device (LA-950 manufactured by HORIBA, Ltd.), and is a volume-based average primary particle size.

Next, the above-described raw material is introduced into the plasma torch by a carrier gas such as $N_2$ gas or Ar gas. At this time, a $N_2$ gas atmosphere, a $N_2$ and $H_2$ mixed gas atmosphere, a $N_2$ and Ar mixed gas atmosphere, or a $N_2$ and $NH_3$ mixed gas atmosphere is formed inside the plasma torch, and by these mixed gases, a high frequency power is supplied from a high frequency power supply to the induction coil, so that a thermal plasma of $N_2$ gas, a thermal plasma of $N_2$ and $H_2$ mixed gas, a thermal plasma of $N_2$ and Ar mixed gas, or a thermal plasma (plasma flame) of $N_2$ and $NH_3$ mixed gas are generated. Therefore, the raw material introduced into the plasma torch is volatilized and gasified by the thermal plasma of $N_2$ gas having a high temperature of several thousand degrees generated in the plasma torch, that is, a synthesis nitride reaction is carried out by the thermal plasma method. Next, the gasified raw material is rapidly cooled in the chamber through which a cooling gas such as $N_2$ gas or Ar gas circulates, that is, the gasified raw material is instantly cooled and condensed by the cooling gas such as $N_2$ gas or Ar gas in the chamber below the plasma torch, thereby obtaining a zirconium nitride powder containing yttrium. Furthermore, the zirconium nitride powder containing this yttrium is recovered by a bag filter. In this way, a nano-sized (average primary particle size of 10 nm to 50 nm) black material composed of the zirconium nitride powder containing yttrium can be obtained. The average primary particle size of the black material or the like is a value measured in terms of a sphere from the measured value of the specific surface area.

The black material produced as described above contains the yttrium in an amount of 1.0% by mass to 12.0% by mass with respect to a total 100% by mass of the zirconium nitride powder and the yttrium. Therefore, in a transmission spectrum obtained from a dispersion in which a concentration of the zirconium nitride powder containing yttrium is 50 ppm, assuming that a light transmittance at a wavelength of 550 nm is denoted by $X_1$, and a light transmittance at a wavelength of 365 nm is denoted by $X_2$, $X_1$ is 7.5% or less, $X_2$ is 25% or more, and $X_2/X_1$ is 3.5 or more, thereby capable of improving an ultraviolet ray transmittance. That is, it is possible to improve the light-shielding property at a wavelength of 550 nm while maintaining the ultraviolet ray transmittance having a wavelength of 365 nm as compared with a black material in the related art. It is presumed that the reason why the light-shielding property at a wavelength of 550 nm and the ultraviolet ray transmittance having a wavelength of 365 nm are improved by the zirconium nitride powder including yttrium is because the yttrium has been incorporated into a crystal lattice of zirconium nitride as yttrium nitride.

On the other hand, a black photosensitive composition contains the above-described black material. Specifically, the black photosensitive composition contains a photosensitive resin composed of a photopolymerizable compound and a photopolymerization initiator, and a black material dispersed in the photosensitive resin. Examples of the photopolymerizable compound include acrylic acid ester, methacrylic acid ester, glycidyl ether, glycidyl amine, glycidyl ester, and the like, and examples of the photopolymerization initiator include benzophenone, azobisisobutyl ether, benzoyl peroxide, bis(4-tert-butylphenyl)iodonium hexafluorophosphate, triphenylsulfonium tetrafluoroborate, tri-p-tolylsulfonium trifluoromethanesulfonate, and examples of a solvent include propylene glycol monomethyl ether acetate (PGM-Ac), ethanol, toluene, water, and the like. The amount of the black material is preferably 10% by mass to 50% by mass with respect to 100% by mass of the black photosensitive composition. The amount of the photosensitive resin is preferably 50% by mass to 90% by mass with respect to 100% by mass of the black photosensitive composition, and a mixing ratio of the photopolymerizable compound and the photopolymerization initiator is preferably in a range of (99:1) to (90:10) in terms of a mass ratio. Furthermore, the amount of the solvent is preferably 0% by mass to 50% by mass with respect to 100% by mass of the black photosensitive composition. Here, the reason why the amount of the black material and the amount of the photosensitive resin are limited to the above ranges is because it is intended not to impair the resin characteristics. The reason why the mixing ratio of the photopolymerizable compound and the photopolymerization initiator is limited to the above range is because it is intended to efficiently carry out a polymerization reaction. Furthermore, the reason why the mixing ratio of the solvent is limited to the above range is because the efficiency of the polymerization reaction deteriorates in a case where the mixing ratio deviates from the above-described range.

A method for producing the black photosensitive composition thus composed will be described. First, the photosensitive resin and the solvent are mixed with the black material in a predetermined ratio. Next, this mixture is stirred using a roll mill, a bead mill, a kneader, a mixer, or the like. As a result, a black photosensitive composition in which the black material is dispersed in the photosensitive resin can be obtained.

On the other hand, a black patterning film is formed by the black photosensitive composition. In order to form this black patterning film, first, the black photosensitive composition is applied onto a substrate and then prebaked to evaporate the solvent to form a photoresist film. Next, the photoresist film is exposed to a predetermined pattern shape via a photomask, and then developed with an alkaline developer to dissolve and remove unexposed portions of the photoresist film. Thereafter, post-baking is preferably carried out to form a predetermined black patterning film. The optical density, that is, the optical density (OD) value is known as an index showing the light-shielding property (attenuation of the transmittance) of the formed patterning film. The patterning film formed by using the black material of the present embodiment has a high OD value. Here, the OD value is a value represented by logarithm of a degree of absorption in a case where light passes through the patterning film, and is defined by the following Equation (1). In Equation (1), I is the amount of transmitted light and $I_0$ is the amount of incident light.

$$\text{OD value} = -\log 10(I/I_0) \tag{1}$$

Examples of the substrate include glass, silicon, polycarbonate, polyester, aromatic polyamide, polyamideimide, polyimide, and the like. In addition, as desired, the substrate can also be subjected to appropriate pretreatment such as chemical treatment with a silane coupling agent, plasma treatment, ion plating, sputtering, gas phase reaction method, and vacuum vapor deposition. In a case where the black photosensitive composition is applied to the substrate, an appropriate coating method such as rotary coating, cast coating, and roll coating can be adopted. The coating thickness is usually 0.1 μm to 10 μm, preferably 0.2 μm to 7.0 μm, and still more preferably 0.5 μm to 6.0 μm, as a film thickness after drying. As radiation used for forming the patterning film, in the present embodiment, a radiation having a wavelength in a range of 250 to 370 nm is preferable. The irradiation energy amount of radiation is preferably 10 J/m² to 10,000 J/m².

As the alkaline developer, for example, aqueous solutions such as sodium carbonate, sodium hydroxide, potassium hydroxide, tetramethylammonium hydroxide, choline, 1,8-diazabicyclo-[5.4.0]-7-undecene, 1,5-diazabicyclo-[4.3.0]-5-nonen are preferable. A water-soluble organic solvent such as methanol or ethanol, a surfactant, or the like can be added in an appropriate amount to the alkaline developer. After alkaline development, washing with water is usually carried out. As the developing method, a shower developing method, a spray developing method, a dip (immersion) developing method, a paddle (liquid filling) developing method, and the like can be applied, and developing conditions of 5 seconds to 300 seconds at room temperature are preferable. The patterning film thus formed is suitably used for a high-definition liquid crystal, a black matrix material for organic EL, a light-shielding material for an image sensor, a light-shielding material for an optical member, a light-shielding filter, an IR cut filter, and the like.

Since the black patterning film thus formed contains the above-described black material, the light-shielding property at a wavelength of 550 nm can be improved while maintaining the ultraviolet ray transmittance having a wavelength of 365 nm as compared with the black material in the related art. As a result, in a case where the black patterning film is formed by the black photosensitive composition using the black material, a high-resolution black patterning film can be formed, and the formed black patterning film also has high light-shielding performance.

EXAMPLES

Subsequently, Examples of the present invention will be described in detail together with Comparative Examples.

Example 1

First, 9.8 g of a zirconium dioxide ($ZrO_2$) powder and 0.2 g of an yttrium oxide ($Y_2O_3$) powder were mixed with each other by using a mixer to obtain 10.0 g of the $ZrO_2$ powder in which the amount of $Y_2O_3$ is 2% by mass with respect to a total of 100% by mass of $ZrO_2$ and $Y_2O_3$. 7.39 g of this $ZrO_2$ powder containing $Y_2O_3$, 5.83 g of a metallic magnesium (Mg) powder, and 3.39 g of a magnesium oxide (MgO) powder were mixed in a nitrogen atmosphere to prepare a mixed powder. In this case, the amount of the metallic magnesium (Mg) powder is 4.0 times by mol relative to the $ZrO_2$ powder containing $Y_2O_3$, and the amount of the magnesium oxide (MgO) powder is 1.4 times by mol relative to the $ZrO_2$ powder containing $Y_2O_3$. Next, a reduction reaction was carried out by holding the mixed powder at a temperature of 700° C. for 1 hour in a $N_2$ gas atmosphere. After the reduction reaction was completed, and cooling was carried out, the powder obtained by the reduction reaction was washed with 300 g of 5% hydrochloric acid and further neutralized with $NH_3$ water to prepare a black slurry. Furthermore, the black slurry was filtered, washed, and dried to obtain a black material composed of a zirconium nitride (ZrN) powder containing yttrium. This black material was designated as Example 1. An yttrium content in the zirconium nitride powder containing yttrium was measured by ICP emission spectroscopic analysis.

Comparative Example 1

The zirconium nitride powder described in Example 1 of Patent Document 1 mentioned in Background Art of the present specification was used as a black material of Comparative Example 1. Specifically, 7.3 g of the metallic magnesium powder having an average primary particle size of 150 m and 3.0 g of the magnesium nitride powder having an average primary particle size of 200 nm were added to 7.4 g of the zirconium dioxide ($ZrO_2$) powder, and the mixture was uniformly mixed by a reaction apparatus in which a boat made of graphite has been equipped in a glass tube made of quartz. At this time, the added amount of the metallic magnesium was 5.0 times by mol relative to zirconium dioxide ($ZrO_2$), and the added amount of the magnesium nitride was 0.5 times by mol relative to zirconium dioxide ($ZrO_2$). This mixture was calcined at a temperature of 700° C. for 60 minutes in a nitrogen gas atmosphere to obtain a calcined product. This calcined product was dispersed in 1 liter of water, and 10% hydrochloric acid was gradually added thereto. Thereafter, the mixture was washed at a pH of 1 or higher while maintaining at a temperature of 100° C. or lower, was then adjusted with 25% aqueous ammonia for a pH of 7 to 8, and was filtered. This filtered solid content was redispersed in water at 400 g/liter, was subjected to the acid washing again in the same manner as described above to adjust pH with aqueous ammonia, and was then filtered. After repeating the acid washing-pH adjustment with aqueous ammonia twice in this way, a filtrate was dispersed in ion-exchanged water at 500 g/liter in terms of solid content, heated and stirred at 60° C., adjusted to pH 7, filtered with a suction filtration device, furthermore washed with an equal amount of ion-exchanged water, and dried with a hot air dryer at a set temperature of 120° C. to obtain a zirconium nitride powder. This zirconium nitride powder was used as the black material of Comparative Example 1.

Examples 2 to 5 and Comparative Examples 2 and 3

Black materials of Examples 2 to 5 and Comparative Examples 2 and 3 were obtained in the same manner as in Example 1, except that content ratios of the zirconium dioxide ($ZrO_2$) powder and yttrium oxide ($Y_2O_3$) were set as different ratios from that of the content ratios of the zirconium dioxide ($ZrO_2$) powder and yttrium oxide ($Y_2O_3$) in Example 1 as shown in Table 1.

Example 6

A metallic zirconium powder (purity 99%, average primary particle size of 20 μm) and a metallic yttrium powder (purity 99.9%, average primary particle size of 850 μm), which were used as raw materials, were supplied to a raw material supply machine of a high frequency induced thermal plasma nanoparticle synthesizer (TP40020NPS manufactured by JEOL Ltd.), these raw materials were introduced into a plasma torch and volatilized by thermal plasma of a $N_2$ and Ar mixed gas generated from this plasma torch, and thereafter, the volatilized raw materials were rapidly cooled in a chamber for circulating $N_2$ gas, thereby synthesizing a zirconium nitride powder containing yttrium. This zirconium nitride powder was used as a black material of Example 6. The average primary particle size of this black material was 30 nm.

Comparative Test 1 and Evaluation

A light transmittance $X_2$ (%) at a wavelength of 365 nm in the ultraviolet region and a light transmittance $X_1$ (%) at a wavelength of 550 nm in the visible light region were obtained from spectroscopic curves of the black materials in Examples 1 to 6 and Comparative Examples 1 to 3. Specifically, first, each of the black materials in Examples 1 to 6 and Comparative Examples 1 to 3 was separately placed in a circulating horizontal bead mill (media: zirconia), an amine-based dispersant was added, and thereafter, dispersion treatment was carried out in a propylene glycol monomethyl ether acetate (PGM-Ac) solvent. Next, the obtained 9 kinds of dispersions were diluted 100,000 times and adjusted to have a powder concentration of 50 ppm. Next, the light transmittance of each black material in the diluted dispersion was measured in the wavelength range of 240 nm to 1300 nm by using UH-4150 manufactured by Hitachi High-Tech Fielding Corporation, and each spectroscopic curve was obtained. Furthermore, a light transmittance $X_2$ (%) at a wavelength of 365 nm in the ultraviolet region and a light transmittance $X_1$ (%) at a wavelength of 550 nm in the visible light region were read from each of these spectroscopic curves. In addition, $X_2/X_1$ was calculated from the light transmittance $X_1$ and the light transmittance $X_2$ read from each spectroscopic curve. These results are shown in Table 1. Furthermore, FIG. 1 shows three spectroscopic curves of Example 1, Example 2, and Comparative Example 1.

TABLE 1

| | $ZrO::Y_2O_3$ (mass ratio) | Amount of Y (% by mass) | Light transmittance (%) $X_2$ (365 nm) | Light transmittance (%) $X_1$ (550 nm) | $X_2/X_1$ |
|---|---|---|---|---|---|
| Example 1 | 98:2 | 1.0 | 26.0 | 6.0 | 4.3 |
| Example 2 | 97:3 | 2.5 | 26.0 | 5.5 | 4.7 |
| Example 3 | 90:10 | 3.7 | 26.2 | 6.5 | 4.0 |
| Example 4 | 85:15 | 4.8 | 26.1 | 7.0 | 3.7 |
| Example 5 | 75:25 | 10.0 | 26.1 | 7.3 | 3.6 |
| Example 6 | — | 12.0 | 28.0 | 4.6 | 6.1 |

TABLE 1-continued

| | $ZrO::Y_2O_3$ (mass ratio) | Amount of Y (% by mass) | Light transmittance (%) $X_2$ (365 nm) | Light transmittance (%) $X_1$ (550 nm) | $X_2/X_1$ |
|---|---|---|---|---|---|
| Comparative Example 1 | 100:0 | 0 | 26.0 | 7.6 | 3.4 |
| Comparative Example 2 | 99:1 | 0.9 | 26.1 | 7.6 | 3.4 |
| Comparative Example 3 | 68:32 | 12.2 | 30.4 | 11.1 | 2.7 |

As is clear from Table 1 and FIG. 1, in each of the black materials of Comparative Examples 1 and 2, the amount of yttrium (Y) was 0% by mass and 0.9% by mass, which was less than the appropriate range (1.0% by mass to 12.0% by mass), and the light transmittance $X_2$ at a wavelength of 365 nm was 26.0% and 26.1%, which was within the appropriate range (25% or more). However, the light transmittance $X_1$ at a wavelength of 550 nm was 7.6% in both Comparative Examples 1 and 2, which was higher than the appropriate range (7.5% or less), and $X_2/X_1$ was 3.4 in both Comparative Examples 1 and 2, which was smaller than the appropriate range (3.5 or more).

In addition, as is clear from Table 1, in the black material of Comparative Example 3, the amount of yttrium (Y) was 12.2% by mass, which was higher than the appropriate range (1.0% by mass to 12.0% by mass), and the light transmittance $X_2$ at a wavelength of 365 nm was 30.4%, which was within the appropriate range (25% or more). However, the light transmittance $X_1$ at a wavelength of 550 nm was 11.1%, which was higher than the appropriate range (7.5% or less), and $X_2/X_1$ was 2.7, which was smaller than the appropriate range (3.5 or more).

On the other hand, as is clear from Table 1 and FIG. 1, in each of the black materials of Examples 1 to 6, the amount of yttrium (Y) was within 1.0% by mass to 12.0% by mass, which was within the appropriate range (1.0% by mass to 12.0% by mass), and the light transmittance $X_1$ at a wavelength of 550 nm was within 4.6% to 7.3%, which was within the appropriate range (7.5% or less). In addition, the light transmittance $X_2$ at a wavelength of 365 nm was within 26.0% to 28.0%, which was within the appropriate range (25% or more), and furthermore, $X_2/X_1$ was within 3.6 to 6.1, which was within the appropriate range (3.5 or more).

INDUSTRIAL APPLICABILITY

The black material of the present invention can be used for a high-definition liquid crystal display, a black matrix material for organic electroluminescence (BM material for organic EL), a light-shielding material for an image sensor, a light-shielding material for an optical member, a light-shielding filter, an infrared ray (IR) cut filter, a coverlay film, and the like.

What is claimed is:
1. A black material consisting of a zirconium nitride powder containing yttrium,
   wherein an amount of the yttrium is 1.0% by mass to 12.0% by mass with respect to a total 100% by mass of the zirconium nitride powder and the yttrium, and
   in a transmission spectrum obtained from a dispersion in which a concentration of the zirconium nitride powder containing yttrium is 50 ppm, assuming that a light transmittance at a wavelength of 550 nm is denoted by

$X_1$, and a light transmittance at a wavelength of 365 nm is denoted by $X_2$, $X_1$ is 7.5% or less, $X_2$ is 25% or more, and $X_2/X_1$ is 3.5 or more.

2. A method for producing the black material according to claim 1 comprising:

a step of preparing a mixed powder by mixing a zirconium dioxide powder containing an yttrium oxide powder with either a magnesium oxide powder or a magnesium nitride powder or both of a magnesium oxide powder and a magnesium nitride powder, and a metallic magnesium powder in a $N_2$ gas atmosphere, $N_2$ and $H_2$ mixed gas atmosphere, $N_2$ and Ar mixed gas atmosphere, or $N_2$ and $NH_3$ mixed gas atmosphere;

a step of preparing a zirconium nitride powder containing yttrium by bringing the mixed powder into a nitride reaction in the $N_2$ gas atmosphere, $N_2$ and $H_2$ mixed gas atmosphere, $N_2$ and Ar mixed gas atmosphere, or $N_2$ and $NH_3$ mixed gas atmosphere;

a step of washing and neutralizing the zirconium nitride powder containing yttrium to prepare a black slurry; and a step of separating a solid content from the black slurry and drying the separated solid content.

3. A method for producing a black material comprising:

a step of obtaining the black material according to claim 1 by bringing a metallic zirconium powder and a metallic yttrium powder into a synthesis nitride reaction in a $N_2$ gas atmosphere, $N_2$ and $H_2$ mixed gas atmosphere, $N_2$ and Ar mixed gas atmosphere, or $N_2$ and $NH_3$ mixed gas atmosphere, by a thermal plasma method, to prepare the zirconium nitride powder containing yttrium.

4. A black photosensitive composition comprising the black material according to claim 1.

5. A method for producing a black photosensitive composition, wherein the black photosensitive composition contains the black material produced by the method according to claim 2.

6. A black patterning film formed by the black photosensitive composition according to claim 4.

7. A method for forming a black patterning film, the method comprising a step of forming the black patterning film by using the black photosensitive composition produced by the method according to claim 5.

8. A method for producing a black photosensitive composition, wherein the black photosensitive composition contains the black material produced by the method according to claim 3.

9. A method for forming a black patterning film, the method comprising a step of forming the black patterning film by using the black photosensitive composition produced by the method according to claim 8.

* * * * *